(12) United States Patent
Hill et al.

(10) Patent No.: US 12,206,222 B2
(45) Date of Patent: Jan. 21, 2025

(54) INTEGRATED EDGE-GENERATED VERTICAL EMISSION LASER

(71) Applicant: Apple Inc., Cupertino, CA (US)

(72) Inventors: Jeffrey T. Hill, Los Altos, CA (US); Alfredo Bismuto, Sunnyvale, CA (US); Tomas Sarmiento, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 793 days.

(21) Appl. No.: 17/407,016

(22) Filed: Aug. 19, 2021

(65) Prior Publication Data

US 2022/0059992 A1  Feb. 24, 2022

Related U.S. Application Data

(60) Provisional application No. 63/067,996, filed on Aug. 20, 2020.

(51) Int. Cl.
*H01S 5/00* (2006.01)
*H01S 5/026* (2006.01)
(Continued)

(52) U.S. Cl.
CPC .............. *H01S 5/187* (2013.01); *H01S 5/026* (2013.01); *H01S 5/0267* (2013.01);
(Continued)

(58) Field of Classification Search
CPC ........ H01S 5/187; H01S 5/026; H01S 5/0267; H01S 5/04257; H01S 5/12; H01S 5/185; H01S 5/42
See application file for complete search history.

(56) References Cited

U.S. PATENT DOCUMENTS

| 5,379,354 A | 1/1995 | Jenkins |
| 5,617,439 A | 4/1997 | Kakimoto |

(Continued)

FOREIGN PATENT DOCUMENTS

| EP | 3561561 | 10/2019 |
| FR | 2949024 | 2/2011 |

(Continued)

OTHER PUBLICATIONS

International Search Report and Written Opinion dated Dec. 23, 2021, PCT/US2021/046772, 14 pages.

(Continued)

*Primary Examiner* — Kinam Park
(74) *Attorney, Agent, or Firm* — Brownstein Hyatt Farber Schreck, LLP

(57) ABSTRACT

Configurations for an edge-generated vertical emission laser that vertically emits light and fabrication methods of the edge-generated vertical emission laser are disclosed. The edge-generated vertical emission laser may include a distributed feedback (DFB) laser structure, a grating coupler, and contact layers. Light may propagate through the DFB laser structure, approximately parallel to the top surface of the edge-generated vertical emission laser and be directed by the grating coupler toward the top surface of the edge-generated vertical emission laser. The light may vertically emit from the edge-generated vertical emission laser approximately perpendicular to the top surface of the edge-generated vertical emission laser. Additionally, the contact layers may be n-metal and p-metal, which may be located on the same side of the edge-generated vertical emission laser. These features of the edge-generated vertical emission laser may facilitate ease of testing and increased options for packaging.

20 Claims, 14 Drawing Sheets

(51) Int. Cl.
- *H01S 5/042* (2006.01)
- *H01S 5/12* (2021.01)
- *H01S 5/185* (2021.01)
- *H01S 5/187* (2006.01)
- *H01S 5/42* (2006.01)
- *H01S 5/028* (2006.01)
- *H01S 5/183* (2006.01)

(52) U.S. Cl.
CPC ............ *H01S 5/04257* (2019.08); *H01S 5/12* (2013.01); *H01S 5/185* (2021.01); *H01S 5/42* (2013.01); *H01S 5/028* (2013.01); *H01S 5/18361* (2013.01); *H01S 5/18388* (2013.01)

(56) References Cited

U.S. PATENT DOCUMENTS

| | | |
|---|---|---|
| 5,848,088 A | 12/1998 | Mori et al. |
| 5,940,556 A | 8/1999 | Moslehi et al. |
| 6,031,243 A * | 2/2000 | Taylor .................. H01S 5/2027 372/50.11 |
| 6,330,265 B1 * | 12/2001 | Kinoshita .......... G02B 6/12007 372/50.12 |
| 6,345,133 B1 | 2/2002 | Morozov |
| 6,393,185 B1 | 5/2002 | Deacon |
| 6,556,688 B1 | 4/2003 | Ratnakar |
| 6,584,136 B2 | 6/2003 | Ju et al. |
| 7,269,356 B2 | 9/2007 | Winzer |
| 7,314,451 B2 | 1/2008 | Halperin et al. |
| 7,444,048 B2 | 10/2008 | Peters et al. |
| 7,689,075 B2 | 3/2010 | Jenkins et al. |
| 8,300,994 B2 | 10/2012 | Welch et al. |
| 8,463,345 B2 | 6/2013 | Kuhn et al. |
| 8,515,217 B2 | 8/2013 | Bernasconi et al. |
| 8,724,100 B1 | 5/2014 | Asghari et al. |
| 8,920,332 B2 | 12/2014 | Hong et al. |
| 8,964,796 B2 | 2/2015 | Wunderer et al. |
| 9,028,123 B2 | 5/2015 | Nichol et al. |
| 9,112,330 B2 | 8/2015 | Gronenborn et al. |
| 9,135,397 B2 | 9/2015 | Denyer et al. |
| 9,151,894 B2 | 10/2015 | Okano et al. |
| 9,370,689 B2 | 6/2016 | Guillama et al. |
| 9,643,181 B1 | 5/2017 | Chang |
| 9,766,370 B2 | 9/2017 | Aloe et al. |
| 9,875,560 B2 | 1/2018 | Rajagopalan |
| 9,943,237 B2 | 4/2018 | Baker et al. |
| 9,946,020 B1 | 4/2018 | Horth |
| 10,016,613 B2 | 7/2018 | Kavounas et al. |
| 10,136,859 B2 | 11/2018 | Cutaia |
| 10,203,454 B2 | 2/2019 | Liu |
| 10,238,351 B2 | 3/2019 | Halperin et al. |
| 10,243,684 B2 | 3/2019 | Wen |
| 10,285,898 B2 | 5/2019 | Douglas et al. |
| 10,290,994 B2 | 5/2019 | Uchida et al. |
| 10,687,718 B2 | 6/2020 | Allec et al. |
| 10,996,399 B2 | 5/2021 | Yang et al. |
| 11,158,996 B2 | 10/2021 | Bismuto et al. |
| 2002/0085612 A1 * | 7/2002 | Ju .......................... B82Y 10/00 372/102 |
| 2005/0053112 A1 | 3/2005 | Shams-Zadeh-Amiri |
| 2006/0039646 A1 | 2/2006 | Nashimoto |
| 2010/0158067 A1 | 6/2010 | Nakatsuka et al. |
| 2010/0265983 A1 * | 10/2010 | Adachi ..................... H01S 5/18 372/50.23 |
| 2011/0052114 A1 * | 3/2011 | Bernasconi ............. H01S 5/026 438/31 |
| 2015/0333482 A1 * | 11/2015 | Briggs ................... H01S 5/125 372/45.01 |
| 2016/0224750 A1 | 8/2016 | Kethman et al. |
| 2017/0164878 A1 | 6/2017 | Connor |
| 2017/0207600 A1 * | 7/2017 | Klamkin ................. H01S 5/142 |
| 2020/0253547 A1 | 8/2020 | Harris et al. |
| 2020/0297955 A1 | 9/2020 | Shouldice |
| 2021/0391691 A1 | 12/2021 | Sugiyama et al. |
| 2022/0011157 A1 | 1/2022 | Bismuto et al. |
| 2022/0091333 A1 | 3/2022 | Wu |
| 2022/0099896 A1 | 3/2022 | Arbore et al. |
| 2022/0190550 A1 * | 6/2022 | Hjartarson ............ H01S 5/0265 |
| 2023/0314210 A1 | 10/2023 | Bismuto et al. |
| 2024/0077679 A1 | 3/2024 | Arbore et al. |
| 2024/0156401 A1 | 5/2024 | Harris et al. |

FOREIGN PATENT DOCUMENTS

| | | |
|---|---|---|
| JP | S60127776 | 7/1985 |
| JP | S63177495 | 7/1988 |
| JP | 2000077776 | 3/2000 |
| JP | 2001284702 | 10/2001 |
| JP | 2015138870 | 7/2015 |
| JP | 2016189437 | 11/2016 |
| WO | WO 02/011339 | 2/2002 |
| WO | WO 11/090274 | 7/2011 |

OTHER PUBLICATIONS

Gonzalez-Sanchez et al., "Capacitive Sensing for Non-Invasive Breathing and Heart Monitoring in Non-Restrained, Non-Sedated Laboratory Mice," Sensors 2016, vol. 16, No. 1052, pp. 1-16.

He et al., "Integrated Polarization Compensator for WDM Waveguide Demultiplexers," *IEEE Photonics Technology Letters* vol. 11, No. 2, Feb. 1999, pp. 224-226.

Kybartas et al., "Capacitive Sensor for Respiratory Monitoring," Conference "Biomedical Engineering," Nov. 2015, 6 pages.

* cited by examiner

INTEGRATED EDGE-GENERATED VERTICAL EMISSION LASER

CROSS-REFERENCE TO RELATED APPLICATION

This application is a nonprovisional of, and claims the benefit under 35 U.S.C. § 119(e) of, U.S. Provisional Patent Application No. 63/067,996, filed Aug. 20, 2020, the contents of which are incorporated herein by reference as if fully disclosed herein.

FIELD

This disclosure relates generally to a light source for vertically emitting light. More particularly, this disclosure relates to an edge-generated vertical emission laser modified to emit vertically with lower thermal resistance and reduced spreading current.

BACKGROUND

Generally, light sources such as diodes and lasers are used in everyday devices such as televisions, computer mice, laser printers, and so forth. The type of light source may be selected based on any number of characteristics, such as emission wavelength of light, reliability, size of the device, cost, and so forth. In some examples, attributes of one type of laser may make the laser a more appropriate choice for the particular application. For example, a vertical cavity surface emitting laser (VCSEL) may be an appropriate selection for providing an array of lasers. Even though VCSELs may be desirable for some applications due to the ability to assemble the lasers in an array and because of the on wafer testing capabilities, VCSELs may not fulfill all of the requirements of some applications, thus making this type of laser a less attractive selection.

SUMMARY

Embodiments of the systems, devices, methods, and apparatuses described in the present disclosure are directed to an edge-generated vertical emission laser that vertically emits light. Also described are systems, devices, and methods directed to the vertical emission of light by an edge-generated vertical emission laser. The edge-generated vertical emission laser may include a distributed feedback (DFB) laser structure and a grating coupler. The DFB laser structure may generate light that propagates parallel to the active region of the DFB laser structure and also parallel to the top surface of the edge-generated vertical emission laser. As used herein, the "top surface" may refer to the surface from which light may emit from the edge-generated vertical emission laser and the "bottom surface" may refer to the opposite surface from the "top surface" of the edge-generated vertical emission laser. The light may propagate toward the grating coupler and the grating coupler may direct the light toward a top surface of the edge-generated vertical emission laser for vertical emission from the top surface. The vertically emitted light may be perpendicular to the active region of the DFB laser structure and also perpendicular to the top surface of the edge-generated vertical emission laser. In some examples, the vertical emission of light may facilitate increased ease of packaging and on-wafer testing, which may increase laser yield during fabrication.

In some examples, the present disclosure describes an edge-generated vertical emission laser that vertically emits light. The edge-generated vertical emission laser that vertically emits light may include a distributed feedback (DFB) laser structure configured to generate light that propagates parallel to a top surface of the edge emitting laser, a grating coupler, configured to receive the generated light from the DFB laser structure and direct the generated light toward a top surface of the edge-generated vertical emission laser that is perpendicular to the top surface of the edge-generated vertical emission laser, an optical element configured to allow light to emit from the top surface of the edge-generated vertical emission laser, and a metal contact on a bottom surface of the edge-generated vertical emission laser, the bottom surface opposite the top surface of the edge-generated vertical emission laser. In some examples, the metal contact may include an n-metal contact on the bottom surface of the edge-generated vertical emission laser and a p-metal contact on the bottom surface of the edge-generated vertical emission laser. In some examples, the optical element may be a collimating and light directing optical element and the edge-generated vertical emission laser may include an anti-reflective coating on the optical element. In some examples, the optical element comprises an integrated microlens array and the edge-generated vertical emission laser may include an anti-reflective coating disposed on the integrated microlens array. In some examples, the grating coupler may be a high contrast grating configured to direct light to the top surface of the edge-generated vertical emission laser.

Additionally in some examples, the metal contact may include an n-metal contact and a p-metal contact where the n-metal contact and p-metal contact are both on the bottom surface of the edge-generated vertical emission laser, thereby providing electrical contact on one side of the edge-generated vertical emission laser. In some examples, the grating coupler may be a time parity grating coupler operative to direct light to the top surface of the edge-generated vertical emission laser. In some examples, the edge-generated vertical emission laser that vertically emits light may include a back facet of the DFB laser structure and a high reflectivity material may be positioned at the back facet of the DFB laser structure. In some examples, the grating coupler may be a second order grating. In some examples, the metal contact may be operative to redirect light propagating toward the bottom surface of the edge-generated vertical emission laser to the top surface of the edge-generated vertical emission laser. In some examples, the edge-generated vertical emission laser that vertically emits light may include a back facet of the DFB laser structure coated with an anti-reflective material.

In some examples, the present disclosure describes a method for providing vertically emitting light using an edge-generated vertical emission laser. The method may include generating light in a distributed feedback (DFB) laser structure that propagates parallel to a top surface of the edge-generated vertical emission laser and within the DFB laser structure, directing, using a grating coupler that is part of the edge-generated vertical emission laser, light from the DFB laser structure toward the top surface of the edge-generated vertical emission laser, and emitting light perpendicular to an active region of the DFB laser structure and from the top surface of the edge-generated vertical emission laser. In some examples, the method may include providing a p-metal contact on a bottom surface of the edge-generated vertical emission laser, providing an n-metal contact on the bottom surface of the edge-generated vertical emission laser, reflecting, via a high-reflectivity material, light from a back facet of the DFB laser structure, and steering the emitted light using diffractive optics at the top surface of the edge-generated vertical emission laser. In some examples, the method may include emitting a predetermined amount of light from a back facet of the DFB laser structure of the edge-generated vertical emission laser, detecting the emitted predetermined amount of light using a photodetector, and monitoring properties of the emitted predetermined amount of light using the photodetector. In some examples, the method may include directing the light emitted from the top surface of the edge-generated vertical emission laser using a bonded microlens array. In some examples, the method may include providing a p-metal contact on a bottom surface of the edge-generated vertical emission laser, providing an n-metal contact on the bottom surface of the edge-generated vertical emission laser, and redirecting the generated light propagating toward the bottom surface of the edge-generated vertical emission laser back to the top surface of the edge-generated vertical emission laser.

In some examples, the present disclosure describes an edge-generated vertical emission laser. The edge-generated vertical emission laser may include a distributed feedback (DFB) laser structure configured to generate light, a waveguide operative to propagate the generated light parallel to a top surface of the edge-generated vertical emission laser, a grating coupler that is part of the edge-generated vertical emission laser, operative to reflect the generated light toward a top surface of the edge-generated vertical emission laser such that the light is emitted perpendicular to the top surface of the edge-generated vertical emission laser, and a metal contact on a bottom surface of the edge-generated vertical emission laser, the bottom surface opposite the top surface of the edge-generated vertical emission laser. In some examples, the metal contact is an n-metal contact and the edge-generated vertical emission laser may include a p-metal contact on a same side of the edge-generated vertical emission laser as the n-metal contact, a diffraction based collimating optical element configured to receive the generated light, and an anti-reflective coating disposed on the diffraction based collimating optical element. In some examples, the edge-generated vertical emission laser may include a back facet configured to receive a portion of the generated light propagating away from the grating coupler in the waveguide and an anti-reflective coating disposed on the back facet. In some examples, the edge-generated vertical emission laser may include a back facet configured to receive a portion of the generated light propagating away from the grating coupler in the waveguide and a dielectric stack disposed on the back facet of the edge-generated vertical emission laser. In some examples, the edge-generated vertical emission laser may include a grating positioned at a light output, where the grating may be configured to receive the light from the grating coupler and emit the light from the top surface of the edge-generated vertical emission laser.

In addition to the exemplary aspects and embodiments described above, further aspects and embodiments will become apparent by reference to the drawings and by study of the following description.

BRIEF DESCRIPTION OF THE DRAWINGS

The use of the same or similar reference numerals in different figures indicates similar, related, or identical items.

Figure 1A:
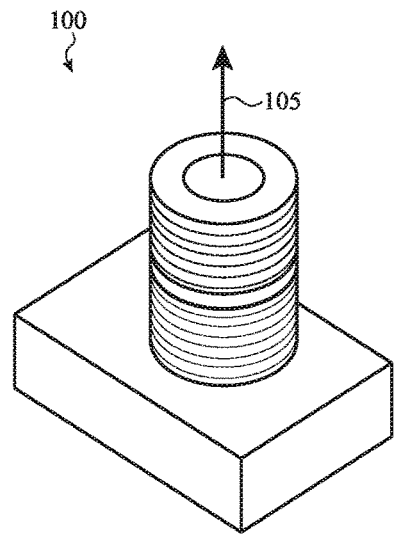
FIG. 1A illustrates an example of a light source.

Additionally, it should be understood that the proportions and dimensions (either relative or absolute) of the various features and elements (and collections and groupings thereof) and the boundaries, separations, and positional relationships presented between them, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to any single embodiment. To the contrary, it is intended to cover alternatives, modifications, and equivalents as can be included within the spirit and scope of the described embodiments as defined by the appended claims. Likewise, although multiple embodiments are described with certain terminology, elements, and structures, it should be appreciated that any embodiment disclosed herein may incorporate terminology, elements, and/or structures disclosed with respect to other embodiments.

Generally, mobile devices may be used for a myriad of functions in addition to placing telephone calls, such as sensing and processing light to measure a user's biometric information, proximity sensing, ambient light sensing, and so forth. Mobile electronic devices and wearable electronic devices for sensing biometric information are growing in popularity and these devices may be small enough to be portable, hand held, or comfortably worn by a user. Such devices may include mobile devices, wearable devices, tablets, laptops, AR/VR/MR/XR headsets and/or glasses, GPS watches, wearable fitness trackers, any type of mobile computing device, and so forth. Different biometric information may be provided to the user such as heart rate, blood oxygenation, fingerprints, retinal patterns, blood vessel patterns, finger lengths, and so forth. The architectures of these mobile biometric electronic devices may include various components in different configurations, which may affect the size of the device into which the component is incorporated.

Because of the increasing emphasis on smaller, more compact electronic devices, the size and thickness of the components and packaging options inside of the electronic device may be limited. In some examples, a particular size of the electronic device is targeted and each component within the electronic device is given a maximum form factor or area that the component(s) may occupy within the electronic device. Accordingly, the physical configuration of the individual components, such as light sources, packaging, electrical connections, optical elements, optical transceivers, grating couplers, polarizers, optical lenses, display stacks, and integrated circuits, such as a photonics integrated circuit and/or a photonics assembly, may become increasingly important to the form factor of the device.

VCSELs may be used in various applications and may be configured into arrays, such that light is emitted from the top surface of the array (e.g., from top surfaces of commonly-aligned VCSELs in the array). Additionally, VCSELs may be on-wafer tested due to this vertical light emission. This allows for testing multiple VCSELs at the same time during fabrication, which may decrease test time and increase VCSEL die yield.

Although VCSELs provide some advantages due to this vertical emission of light, VCSELs may not acceptably function in certain wavelength ranges of light and also may not be capable of the optical power or reliability of other light sources, such as edge-emitting lasers. In some examples, edge-emitting lasers may emit light in a near infrared wavelength range of light, which are wavelengths over which VCSELs may not perform reliably. This wavelength range of light may be desirable for a number of sensing applications, such as proximity sensing, used by handheld devices such as mobile devices and/or wearable devices.

In some examples, an edge-generated vertical emission laser may vertically emit light from a top surface, as described herein. Additionally, edge-emitting lasers that vertically emit light may be referred to as "edge-generated vertical emission lasers." Generally, edge-emitting lasers and edge-generated vertical emission lasers may include layers that function as a waveguide around an active region. Additionally, edge-emitting lasers and edge-generated vertical emission lasers may include layers where the active region may be one or more of these layers that is approximately parallel to the substrate in which the edge-emitting lasers and edge-generated vertical emission lasers is formed. As described herein, edge-emitting lasers and edge-generated vertical emission lasers generate light in response to an applied current from a current source, in a direction that is parallel to the active region and that propagates parallel to the active region as well as the top surface. Insofar as light being described as propagating parallel to the top surface or the bottom surface, the light may be propagating approximately parallel to and along the layers. As used herein, the term "edge-emitting laser" may refer to general edge-emitting lasers that generate and emit light approximately parallel to the active region layer.

Additionally, as used herein, a DFB laser structure may refer to a gain medium, grating, and a cavity. Further, as used herein, a semiconductor laser and an edge-generated vertical emission laser may refer to a DFB laser structure, a grating coupler, a passivation layer, an optical element such as an integrated microlens array, and/or a contact layer, and/or any other coatings and/or optical elements or lenses, any of which may be deposited, bonded, evaporated, plated, adhered, any combination thereof and so forth, to the edge-generated vertical emission laser before packaging. Generally, free-space optics may not be part of the semiconductor laser or the edge-generated vertical emission laser.

By contrast, VCSELs may include layers of mirrors on both sides of the active region layer(s) where the active region layer is approximately parallel to the substrate in which the laser is formed and VCSELs generate light in a direction that is perpendicular to the active region. Although the edge-generated vertical emission lasers may emit light vertically, the light is still generated and propagates parallel to the active region before being redirected vertically by the integrated grating coupler.

In some examples, the edge-generated vertical emission laser may include a DFB laser structure, a waveguide, and a grating coupler. The DFB laser structure may generate light, which may propagate through the waveguide toward the grating coupler. The grating coupler may be configured to receive the light and redirect the light toward the top surface of the edge-generated vertical emission laser for vertical emission. The edge-generated vertical emission laser may also include a p-type metal contact and an n-type metal contact, and the positioning of the p-type and n-type metal contacts may allow for increased packaging options such as flip-chip bonding. Additionally, because of the vertical light emission from the edge-generated vertical emission laser, the laser dies may be on-wafer tested during the fabrication process, which may lead to an increased laser die yield. Vertical light emission may also facilitate increased packaging options such as arranging the edge-generated vertical emission lasers into arrays, or providing an array of edge-generated vertical emission lasers on a single die. Further, by arranging edge-generated vertical emission lasers into an array, the device into which the array is incorporated may benefit from the power, reliability, wavelength ranges, and so forth of the edge-emitting lasers, while simultaneously providing a compact package for the device for various applications such as proximity sensing, biometric sensing, touch sensing, light sensing, any combination thereof, and so forth.

Disclosed herein are optical systems, devices, and methods for an edge-generated vertical emission laser that vertically emits light. The edge-generated vertical emission laser structure may include a DFB laser structure and a grating coupler. The DFB laser structure may generate light, which may propagate through the DFB laser structure and approximately parallel to the top surface of the edge-generated vertical emission laser. The grating coupler may receive the light and may direct the light toward the top surface of the edge-generated vertical emission laser. In some examples, the grating coupler may be a high contrast grating coupler or a time-parity grating coupler. The light may vertically emit from the edge-generated vertical emission laser. In some examples, the light may be collimated and directed when exiting the edge-generated vertical emission laser at or near the top surface of the edge-generated vertical emission laser using one or more optical elements, such as an integrated microlens array, a bonded microlens array, or a grating.

These and other embodiments are discussed below with reference to FIGS. 1-7. However, those skilled in the art will readily appreciate that the detailed description given herein with respect to these figures is for explanatory purposes only and should not be construed as limiting.

Directional terminology, such as "top", "bottom", "upper", "lower", "above", "below", "beneath", "front", "back", "over", "under", "left", "right", and so forth, is used with reference to the orientation of some of the components in some of the figures described below. Because components in various embodiments can be positioned in a number of different orientations, directional terminology is used for purposes of illustration only. The directional terminology may be used to set forth relational positions or to describe aspects of elements discussed in the application, but does not limit the overall device to be used and/or positioned in any particular orientation. For example, if a laser is incorporated into a larger device, the "top surface" of the laser need not correspond to the "top surface" of the larger device. Additionally, the directional terminology is intended to be construed broadly, and therefore should not be interpreted to preclude components being oriented in different ways.

Representative applications of methods and apparatuses according to the present disclosure are described in this section. These examples are being provided solely to add context and aid in the understanding of the described examples. It will thus be apparent to one skilled in the art that the described examples may be practiced without some or all of the specific details. Other applications are possible, such that the following examples should not be taken as limiting.

FIG. 1A illustrates an example of a light source 100, which is a semiconductor vertical cavity surface emitting laser (VCSEL). VCSELs emit light 105 perpendicularly to the active region of the laser and to the top surface of the laser. VCSELs may be used in various applications including optical transceivers for telecommunications, laser printers, biological tissue analysis, and so forth. In some examples, VCSELs may be simultaneously fabricated in large numbers such as several thousands of lasers on a single wafer and diced into individual devices or arrays of devices. VCSELs may be tested at multiple stages during the fabrication process, which may allow for higher yield and reduced processing cost. Additionally, depending on the particular application, VCSELs may be selected due to the scalability of the dies and may be arranged into arrays of light sources. In some examples, VCSELs may be manufactured and diced in VCSEL arrays. In some examples, because light emits from the top surface of the VCSEL and perpendicularly to the active region, various packaging and interconnect options may be available such as flip-chip bonding. Although VCSELs have many desirable characteristics as previously discussed, certain features such as reliability and the wavelength emission range of light may present drawbacks in some applications or when incorporated into electronic devices with limited internal space.

Figure 1B:
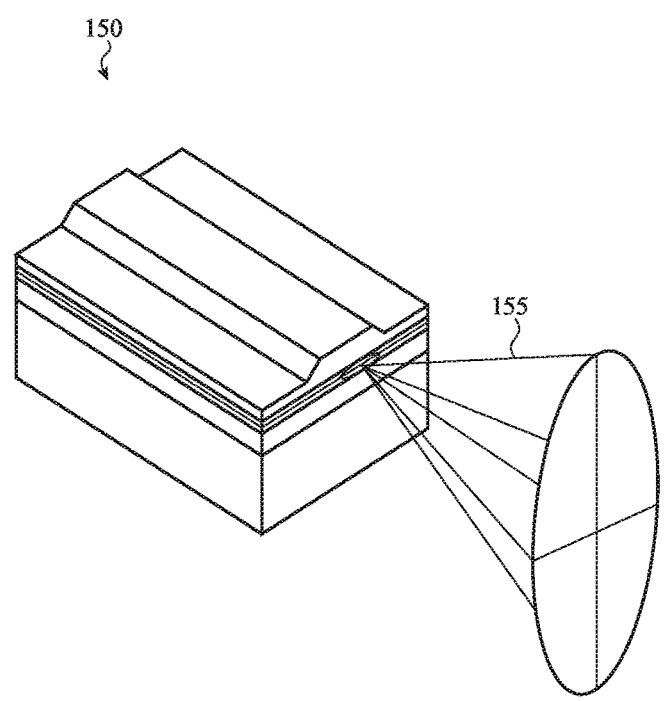
FIG. 1B illustrates an example of a light source.

FIG. 1B illustrates an example of a light source 150, which is a semiconductor edge-emitting laser die. Generally, edge-emitting lasers emit light 155 parallel to both the active region of the laser and the top surface of the laser. In using edge-emitting lasers, light may be coupled or reflected out of a cleaved edge on the side of the laser such that the light emission is parallel to the active region of the laser. The light in an edge-emitting laser may propagate within the laser in a structure similar to that of a waveguide and in some examples employs a double heterojunction. Edge-emitting lasers may have a low-threshold pumping power and high efficiency, thus may be used in various applications, such as optical communications, material processing, and biometric sensing applications. Although packaging standard edge-emitting lasers pose some additional challenges over VCSELs, edge-emitting lasers also may perform well in reliability and may exceed VCSELs in performance and/or reliability depending on the wavelength range of light. As discussed herein, the light may be described as emitting parallel or perpendicular to the top surface of the light source, but the light may be understood to emit approximately parallel or approximately perpendicular to the top surface of the light source. Additionally, it may be understood that the lasers are fabricated in or on a substrate, such as a wafer, through a series of processing steps which will be described in further detail with respect to FIGS. 5A-5R.

Figure 2:
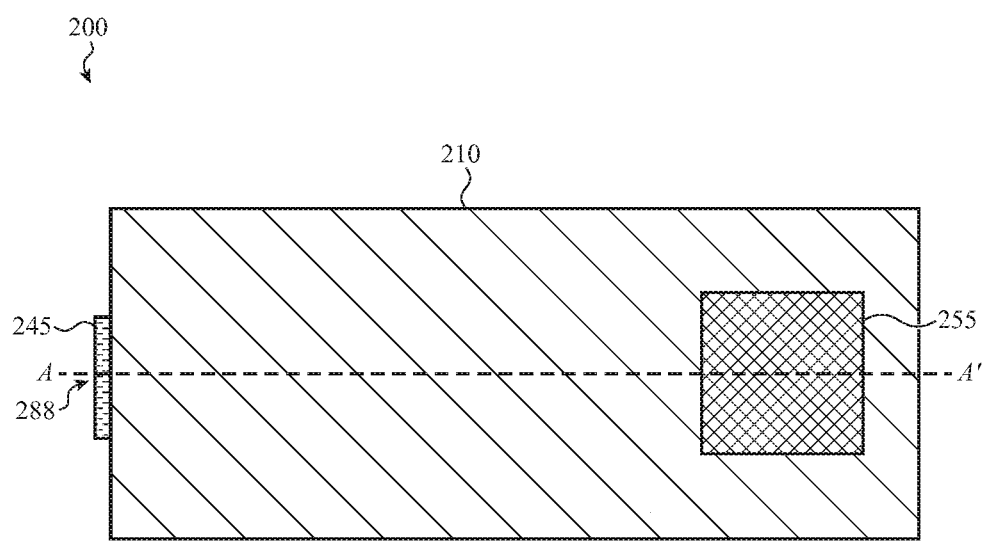
FIG. 2 illustrates a top view of one example of an edge-generated vertical emission laser.

FIG. 2 illustrates a top view of one example of an edge-generated vertical emission laser 200. The edge-generated vertical emission laser 200 may include a distributed feedback (DFB) laser structure, a grating coupler, a passivation layer, an optical element such as an integrated microlens array, and a contact layer. The elements of the edge-generated vertical emission laser 200 will be described in further detail with reference to FIGS. 2-6. Although the laser structure includes a gain medium, grating, and a cavity (e.g., the DFB laser structure), the vertical emission edge-generated laser 200 may include a distributed feedback (DFB) laser structure, a grating coupler, a passivation layer, an optical element such as an integrated microlens array, and a contact layer, or any other coatings and/or or optical elements or lenses that may be deposited, bonded, evaporated, plated, adhered, any combination thereof and so forth, to the edge-generated vertical emission laser before packaging.

Figure 3:
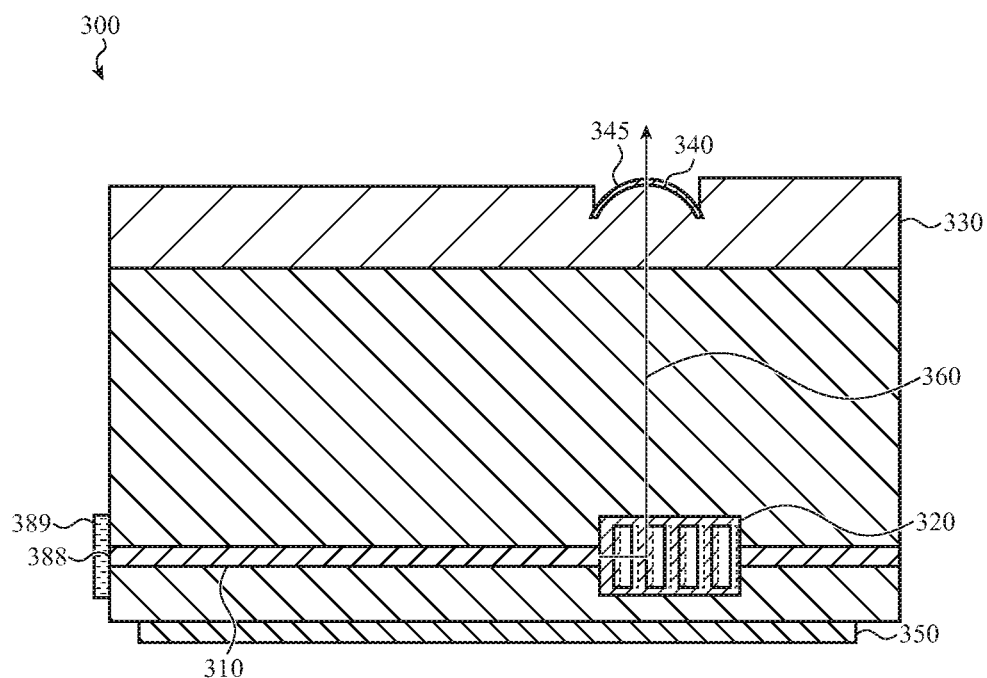
FIG. 3 illustrates a cross-section view of one example of an edge-generated vertical emission laser.
Figure 4:
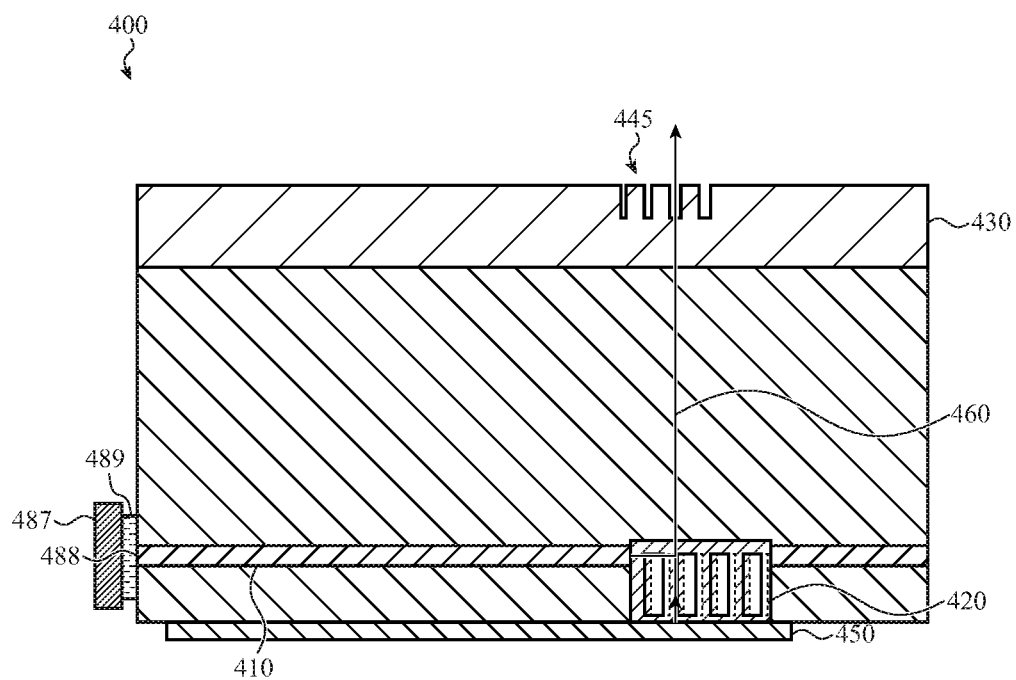
FIG. 4 illustrates a cross-section view of one example of an edge-generated vertical emission laser.

In FIG. 2, the edge-generated vertical emission laser 200 includes an optical element 255 and a material 245. As shown in FIG. 2, the material 245 may be positioned at the back facet 288 of the edge-generated vertical emission laser 200. In some examples, the material 245 may be a high-reflectivity material and may function as a mirror. The high-reflectivity material may be employed at the back facet 288 to reflect light that propagates toward the back facet 288 of the edge-generated vertical emission laser 200. In some examples, the high-reflectivity material may be a material such as metal or a dielectric mirror, while in other examples the material 245 may be a low-reflectivity material such as an anti-reflective coating. In some examples, the high-reflectivity material may be used in combination with the low-reflectivity material. The functionality and use of the material 245 will be discussed in further detail with respect to FIG. 5P. The optical element 255 may be an integrated microlens array that may be fabricated or formed directly in a substrate or into one of the layers of the edge-generated vertical emission laser, and that may collimate and direct (or "steer") the light at the surface of the edge-generated vertical emission laser 200. In some examples, the optical element 255 may be a grating as described with reference to FIGS. 3 and 4. In some examples, the optical element 255 may be a bonded microlens array as opposed to a fabricated microlens array, where the bonded microlens array may be formed separately from and attached to the edge-generated vertical emission laser as part of the edge-generated vertical emission laser. FIGS. 3 and 4 are cross-sectional along line A-A' in FIG. 2 showing different embodiments.

FIG. 3 illustrates a cross-section view of another example of an edge-generated vertical emission laser 300. The edge-generated vertical emission laser 300 includes a substrate with a distributed feedback (DFB) laser structure 310, a grating coupler 320, a passivation layer 330, an integrated microlens array 340, and a contact layer 350. The substrate may be the wafer in or on which the processing is performed to fabricate the edge-generated vertical emission laser 300. The substrate may be any type of material such as III-V or II-VI material combinations (e.g., GaAs, GaP, InGaP, InGaAs, and so forth) or any other material or combination of materials, such as sapphire. In FIG. 3, the edge-generated vertical emission laser 300 may generate light in the DFB laser structure 310; the light may propagate approximately parallel to the active region of the DFB laser structure 310 and also approximately parallel to the surface of the edge-generated vertical emission laser 300. Generally, with an edge-emitting laser, the light would continue to propagate parallel to the active region of the DFB laser structure 310 and exit at a cleaved front facet from the side edge of the substrate. Although the light may propagate parallel to the surface of the edge-generated vertical emission laser 300 in FIG. 3, the light may be emitted along light path 360, which may be approximately perpendicular to the surface of the edge-generated vertical emission laser 300. Although the edge-generated vertical emission laser 300 depicts different layers, structure, and elements relative to one another, FIG. 3 is not drawn to scale and the elements of the edge-generated vertical emission laser 300 may be larger or smaller relative to one another.

In FIG. 3, the DFB laser structure 310 includes an active region (not individually depicted in FIG. 3), which in some examples may include a periodic structure, such as a DFB diffraction grating (not individually depicted in FIG. 3). The edge-generated vertical emission laser 300 may be an indium phosphide based edge-generated vertical emission laser and may emit light in the near infrared wavelength range of light, for example approximately 1200 nanometers. In some examples, the edge-generated vertical emission laser 300 may emit wavelengths other than 1200 nanometers, such as a wavelength of light in a higher wavelength range or lower wavelength range of light according to the application for which it is used. Additionally, other alternative materials may be used for the edge-generated vertical emission laser 300, such as other III-V or II-VI material combinations (e.g., GaAs, GaP, InGaP, InGaAs, and so forth) or any other material or combination of materials.

In some examples, the DFB laser structure 310 may generate light, which may propagate along the DFB laser structure 310 toward the grating coupler 320 and approximately parallel to the surface of the edge-generated vertical emission laser 300. In some examples, the DFB laser structure 310 design may have similar properties to a time parity grating in that it may enhance the forward facing wave, or the light propagating toward the grating coupler 320. In some examples, some light may propagate away from the grating coupler 320 along the DFB laser structure 310 and toward a material 389 positioned at or near the back facet of the DFB laser structure 310, which may be on the opposite side of the DFB laser structure 310 from the grating coupler 320. The material 389 may be part of the edge-generated vertical emission laser and may be a high reflectivity material that may function as a mirror and may reflect the light back through the DFB laser structure 310. The high reflectivity material positioned at the back facet will be described in further detail with reference to FIG. 6. In some examples, an anti-reflective material 389 may be positioned at the back facet of the DFB laser structure 310. In some examples, the anti-reflective material positioned at the back facet may be used in combination with a high-reflectivity material such as metal or a dielectric stack.

In some examples, the DFB laser structure 310 may also include a waveguide structure, such as a double heterostructure. Because the edge-generated vertical emission laser 300 emits light from the top surface of the edge-generated vertical emission laser, the vertical emission of light may allow for a compact semiconductor laser that includes the attributes of edge-emitting lasers, such as emitting in a wavelength range of approximately 1200 nanometers and higher and reliability. Also, due to the top surface emission of the edge-generated vertical emission laser 300, the edge-generated vertical emission lasers may include light directing optics (e.g., integrated microlens arrays, bonded microlens arrays, etc. . . . ) to angle the light output of the edge-generated vertical emission lasers. Further, because the edge-generated vertical emission lasers emit light from the top surface, the edge-generated vertical emission lasers may be manufactured and/or packaged into arrays.

As depicted in FIG. 3, the light may propagate through the DFB laser structure 310 and may reflect and/or be directed from the grating coupler 320 along the light path 360 toward the emitting top surface of the edge-generated vertical emission laser 300. Generally, some grating couplers may direct light toward the surface of the edge-generated vertical emission laser 300 as well as toward the bottom surface where the contact layer 350 may be positioned. In the example where light is directed by the grating coupler 320 toward both the top and bottom surfaces of the edge-generated vertical emission laser 300, the contact layer 350 may reflect at least some of the light directed toward the bottom of the edge-generated vertical emission laser 300 back toward the top surface.

When light is directed toward the top and bottom surfaces, this may result in an undesirable loss of light and/or power. Thus, a grating coupler that directs light asymmetrically and primarily toward the top surface of the edge-generated vertical emission laser 300 may be employed. In order to direct light in primarily one direction, the grating coupler may be patterned asymmetrically, so that the grating coupler structure may interact with the light propagating in one direction in one way (e.g., toward the top surface) when compared with the other direction (e.g. toward the bottom surface). Although the grating coupler 320 in FIG. 3 is depicted as a symmetric periodic structure, in some examples, the structure may be asymmetric in one or more directions. For example, the periodic structure may include elements that are spaced apart from one another with a greater pitch on one side than the other side.

Some examples of grating couplers that direct light primarily toward the top surface of the edge-generated vertical emission laser 300 may be high contrast grating couplers and time parity grating couplers. High contrast grating couplers may have a large contrast in the index of refraction with the surrounding materials. In some examples, high contrast grating couplers are effective at manipulating or directing light from propagating parallel to the active region to propagating normal to the surface of the edge-generated vertical emission laser. Time parity grating couplers may shift the modulation of the real and imaginary parts of the index of refraction resulting in the asymmetric diffraction of light. In some examples, the time parity grating coupler may be a first order grating. The first order time parity grating coupler may enhance an efficiency of light directed toward the top surface in that the grating coupler may increase the amount of light directed toward the top surface. Further, the time parity grating coupler may be a first order grating that directs light both toward the top surface and to the bottom surface (e.g., the contact layer 350). In such embodiments, the contact layer 350 may redirect the light propagating toward the bottom surface back toward the top surface.

In other examples, the time parity grating coupler may be a second order grating, which may direct light primarily toward the top surface of the edge-generated vertical emission laser. The grating coupler 320 may be etched through the surface of the edge-generated vertical emission laser 300 as will be described with reference to FIGS. 5M and 5N.

Still with respect to FIG. 3, after the light reflects from the grating coupler 320, it may propagate along light path 360 toward the top surface of the edge-generated vertical emission laser 300. The light may pass through a passivation layer 330 and through an optical element 340, where both the passivation layer 330 and the optical element 340 may be part of the edge-generated vertical emission laser 300. In some examples, the optical element 340 may collimate, diffract, and/or direct or steer the light exiting the top surface of the edge-generated vertical emission laser 300. In some examples, the optical element 340 may be an integrated microlens array, a collimating microlens array, a bonded microlens array, a diffraction based collimating optical element, and so forth. In some examples, the optical element 340 may be more than a single optical element for collimating and steering the light out of the edge-generated vertical emission laser 300. The optical element 340 may have an anti-reflective coating 345 on the surface to reduce back reflections. As illustrated in FIG. 3, the optical element 340 may direct light normal or approximately normal to the top surface of the edge-generated vertical emission laser 300. In some examples, the optical element 340 may direct light at one or more angles, such as normal to the top surface or other angles that are not normal to the top surface such as 30 degrees or 60 degrees, any combination thereof, and so forth. In some examples, the edge-generated vertical emission laser 300 may not include the optical element 340 and the passivation layer 330 may be an anti-reflective coating. In some examples, the passivation layer 330 may passivate the top surface of the edge-generated vertical emission laser and also may be an anti-reflective coating.

The contact layer 350 may provide driving current to the edge-generated vertical emission laser 300. In some examples, the contact layer 350 may be a metal layer that is part of the edge-generated vertical emission laser 300. Although the contact layer 350 is illustrated as a single layer, it may include multiple sections, each defining a separate contact, and/or even more than one type of contact. In some examples, the contact layer 350 may include both an n-type contact and a p-type contact. In some examples, the p-type and n-type contacts may be co-planar electrical contacts, which may facilitate increased integration and package mounting options insofar as the electrical contacts may be on a surface of the laser opposite the one from which light emits; this may enable pick-and-place operations with a high degree of accuracy and may simplify electrical routing in a substrate on which the laser is placed, as well as permit multiple lasers to be spaced more closely in an array since electrical traces need not be run along sidewalls or the lasers, or otherwise between lasers. The term "co-planar" as used herein with reference to the electrical contacts, describe electrical contacts that are on the same side of the edge-generated vertical emission laser 300 and that contact the same plane of the side of the edge-generated vertical emission laser 300, even though the tops of the contacts may be in different planes.

FIG. 4 illustrates a cross-section view of one example of an edge-generated vertical emission laser 400. Similar to the embodiment shown in FIG. 3, in FIG. 4, the edge-generated vertical emission laser 400 includes a DFB laser structure 410, a grating coupler 420, a passivation layer 430, a grating 445, and a contact layer 450. The edge-generated vertical emission laser 400 may generate light, which may propagate approximately parallel to the active region of the DFB laser structure 410 and also approximately parallel to the surface of the edge-generated vertical emission laser 400.

As previously noted, generally edge-emitting lasers emit light that propagates parallel to the active region of the DFB laser structure 410 and that may exit at a cleaved front facet from the edge of the substrate. Although the light may be generated in the DFB laser structure 410 and propagate parallel to the surface of the edge-generated vertical emission laser 400, the light may be vertically emitted along light path 460, which may be approximately perpendicular to the top surface of the edge-generated vertical emission laser 400. Although the edge-generated vertical emission laser 400 depicts different layers, structure, and elements relative to one another, FIG. 4 is not drawn to scale and the elements of the edge-generated vertical emission laser 400 generally may be larger or smaller and also different sizes relative to one another. In FIG. 4, similarly numbered elements to FIG. 3 may include similar functionality. For example, the contact layer 450 may function similarly to the contact layer 350 and may be configured similarly as well.

The light may be generated in the DFB laser structure 410 and propagate toward the grating coupler 420. The light may be directed by the coupler 420 to propagate along light path 460 toward the top surface of the edge-generated vertical emission laser 400 and perpendicular to the active region of the DFB laser structure 410. The light may be received by a grating 445, which may be at or toward the top surface of the edge-generated vertical emission laser 400. The grating 445 may allow the light to vertically emit from the edge-generated vertical emission laser 400. In some embodiments, the design of the grating 445 may be modified to control the light emission so that the light may exit the top surface of the edge-generated vertical emission laser 400 at one or more given angles. Alternatively, the grating 445 may be omitted from the edge-generated vertical emission laser and instead the passivation layer 430 may be an anti-reflective coating. As one option, the passivation layer 430 may be both a passivating and an anti-reflective coating, which may be one or more coatings that include the functionality of one or both of the layers.

In certain embodiments, the light in the DFB laser structure 410 may propagate away from the grating coupler 420 and toward the back facet of the edge-generated vertical emission laser 400. The light may be received by a photodetector 487 to monitor light properties such as wavelength, optical power, and so forth. In some examples, the photodetector may be built into the structure of the edge-generated vertical emission laser 400 as part of the edge-generated vertical emission laser 400. The predetermined amount of light may be some portion of the light that is tapped and/or split off, while the rest of the light may exit the structure. Further, in some examples the portion of light may be received by a photodetector 487 that is external to the edge-generated vertical emission laser structure. In this example in which light may be designed to exit at the back facet 488 of the edge-generated vertical emission laser, the back facet may have an anti-reflective coating 489.

In the embodiments shown in FIG. 4 and similarly to the embodiment 300 of FIG. 3, the contact layer 450 may include a p-metal contact and an n-metal contact, which may both be positioned on the same side of the edge-generated vertical emission laser 400 and as part of the edge-generated vertical emission laser 400. In some examples, the p-metal contact and the n-metal contact may be co-planar with one another. Additionally, the p-metal contact and the n-metal contact on the same side of the edge-generated vertical emission laser 400 may facilitate increased options of integrating the edge-generated vertical emission laser into packages and may also facilitate increased options of package mounting. In some examples, the edge-generated vertical emission laser may be flip-chip bonded for interconnection to external circuitry, such as a printed circuit board.

In some examples, flip-chip bonding may allow a decreased packaging size, which may allow easier integration into some electronic devices, such as a mobile or wearable device. In some examples, flip-chip bonding may be employed as a method for interconnecting semiconductor devices, such as integrated circuits or semiconductor devices, to external circuitry such as a printed circuit board. Generally flip-chip bonding may be implemented as an alternative to wire bonding, where each chip may have a pad with wire soldered or connected to it, which in turn is connected to the external circuitry. In fabricating a die chip, metal pads may have solder bumps deposited on the metal pads. The die chip may then be inverted so that the solder bumps may be brought into contact with or proximate to the metal pads of the electronics. Flip-chip bonding may reduce the size of the optoelectronic device or system and may allow for transmission of higher speed signals as compared to wire bonding. In some examples, this type of bonding may facilitate better heat conduction. Additionally, although the use of solder bumps is discussed, any type of material such as gold or any other appropriate metal or conductive material may be used in place of solder bumps.

In some examples, the grating coupler 420 may be a second order grating and may direct light both toward the top and bottom surfaces of the edge-generated vertical emission laser 400. The light directed toward the bottom surface may be redirected toward the top surface by one or both of the p-metal contact and the n-metal contact. Additionally, the edge-generated vertical emission laser may have lower thermal resistance when compared to standard edge-emitting laser packaging in which the n-metal contact is on the bottom. The lowered thermal resistance may also be beneficial when compared to other light sources that direct light out of the top surface, such as light sources that use mirrors.

Figure 5A:
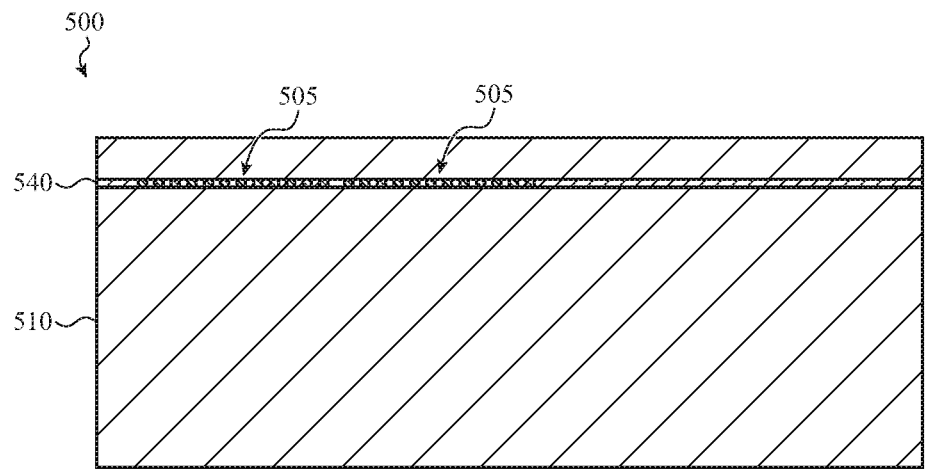
FIGS. 5A-5R illustrate an example fabrication process of an edge-generated vertical emission laser.
Figure 5B:
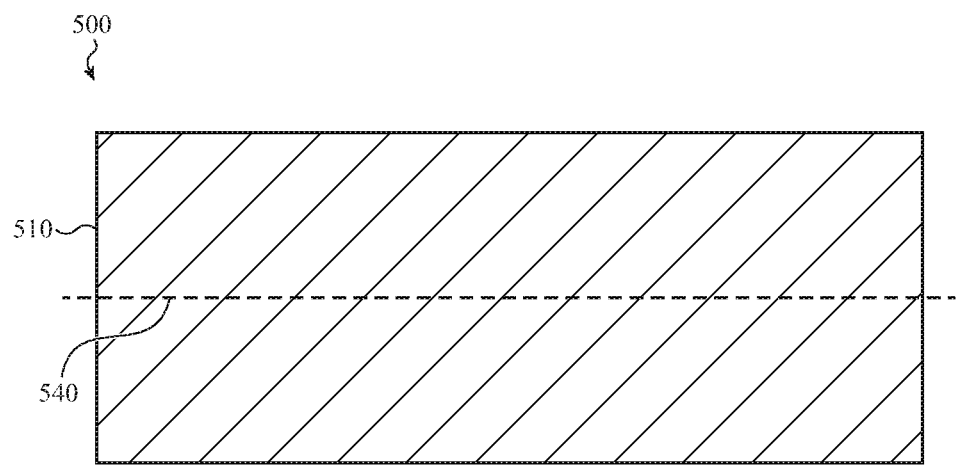
Figure 5C:
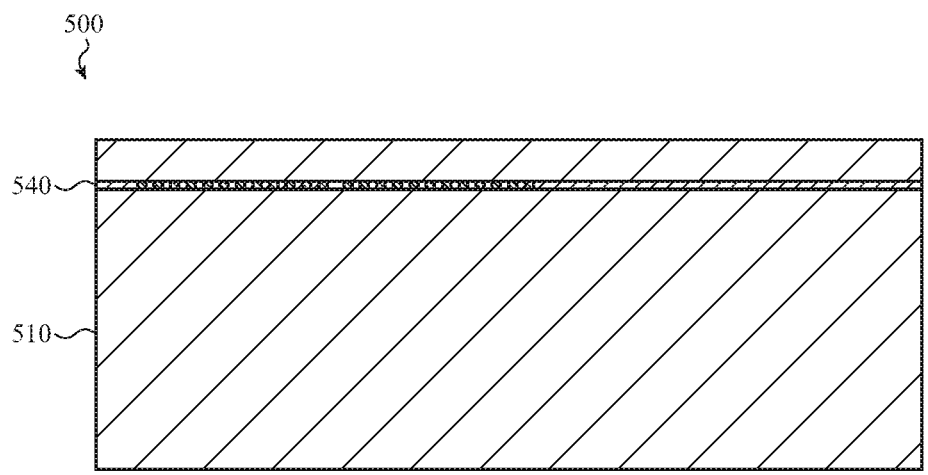
Figure 5D:
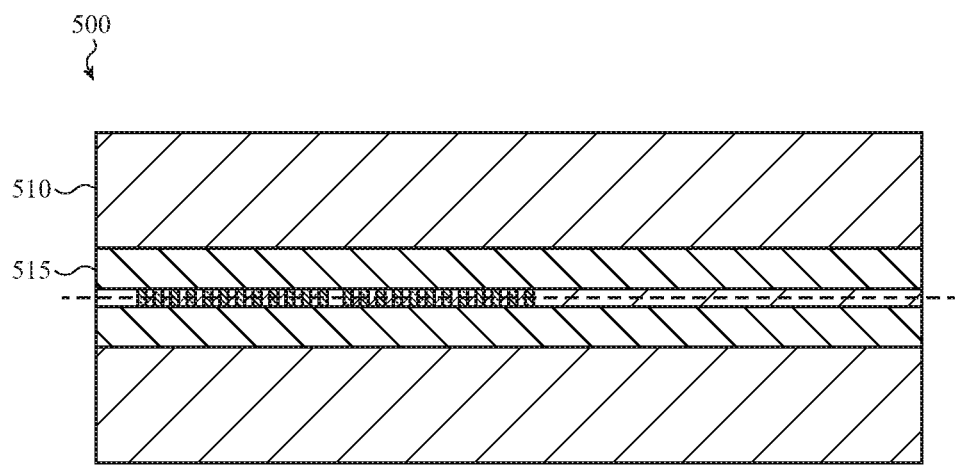
Figure 5E:
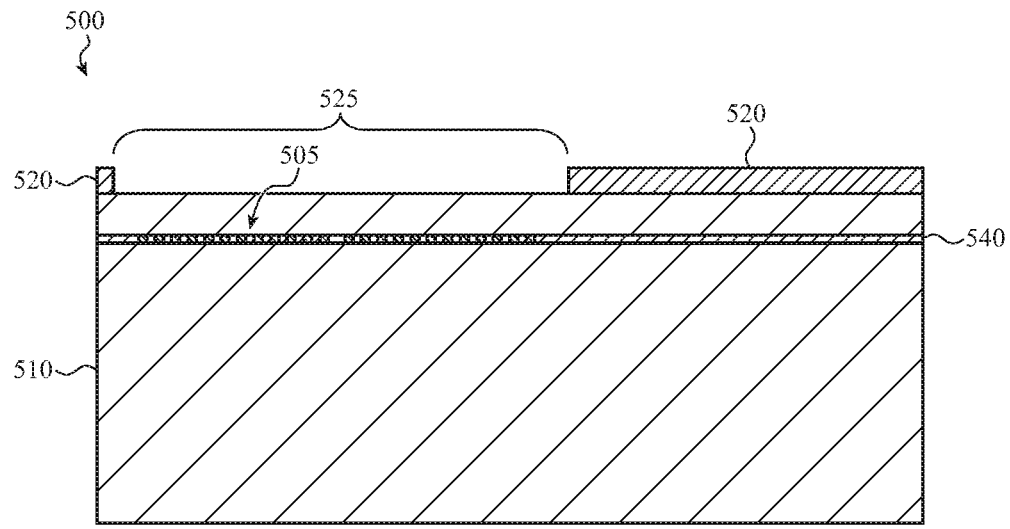
Figure 5F:
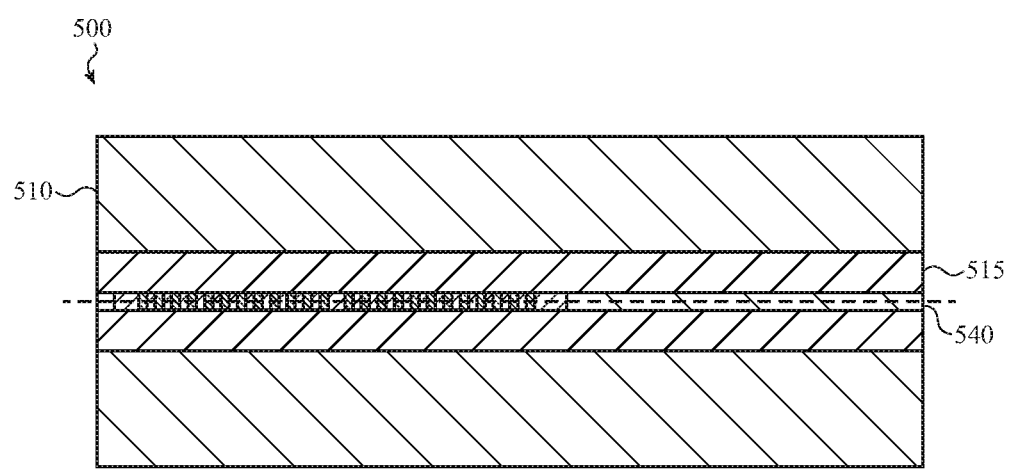
Figure 5G:
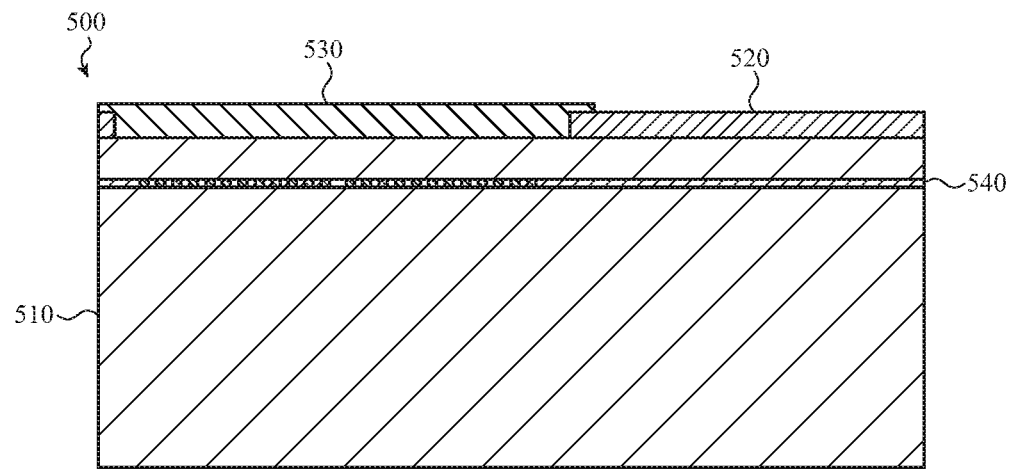
Figure 5H:
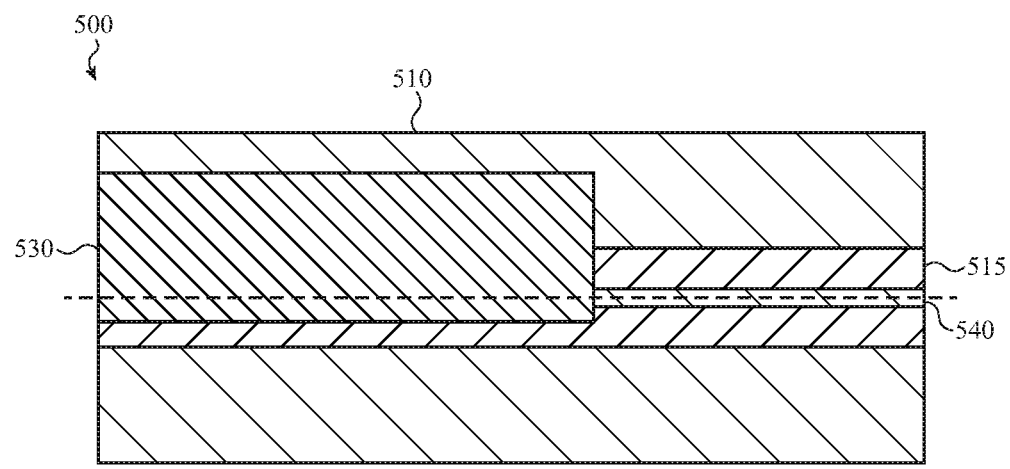
Figure 5I:
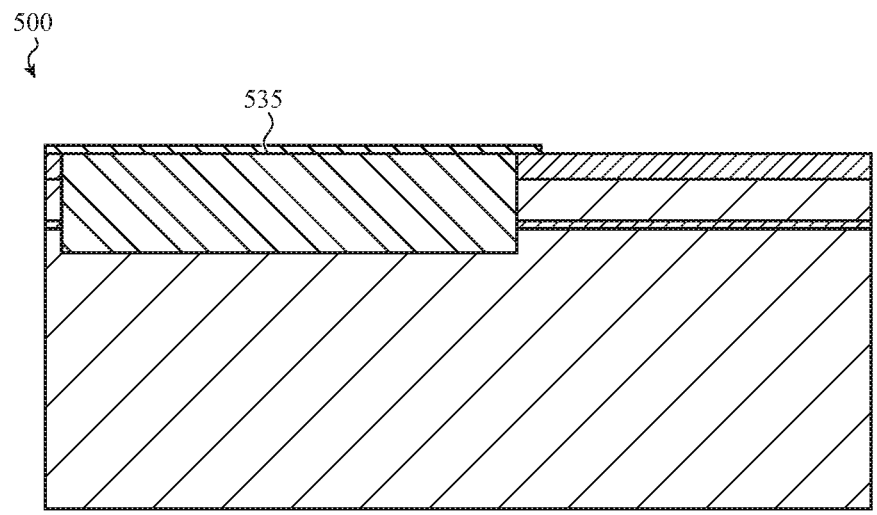
Figure 5J:
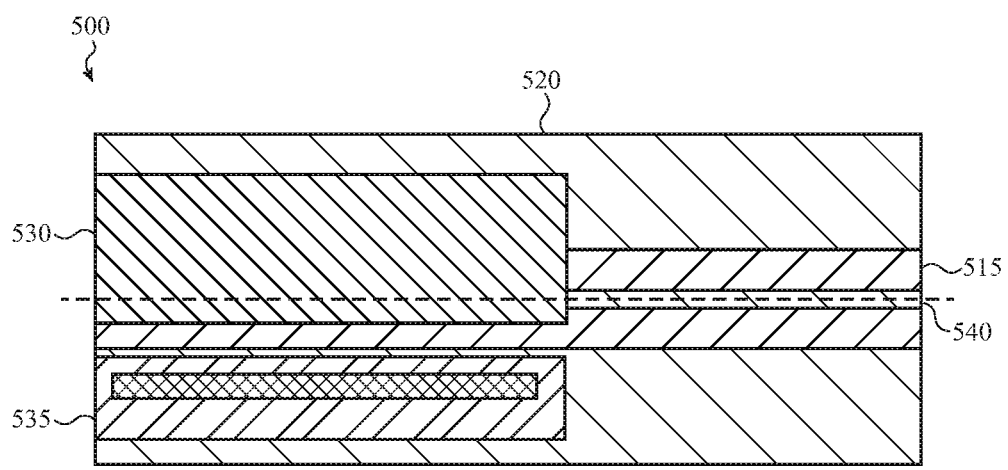
Figure 5K:
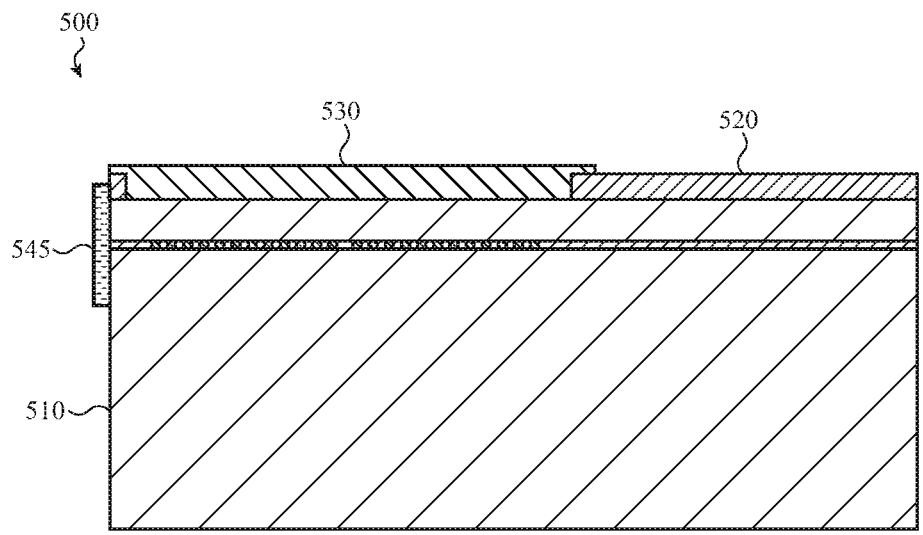
Figure 5L:
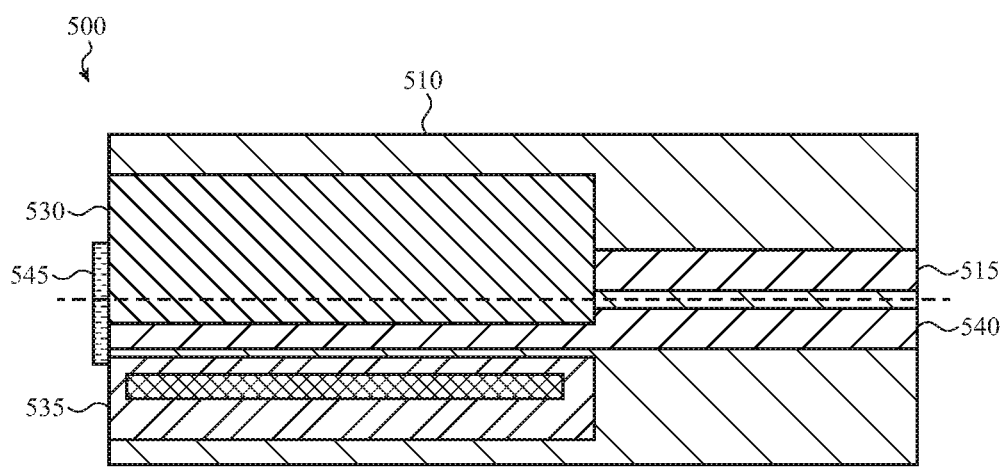
Figure 5M:
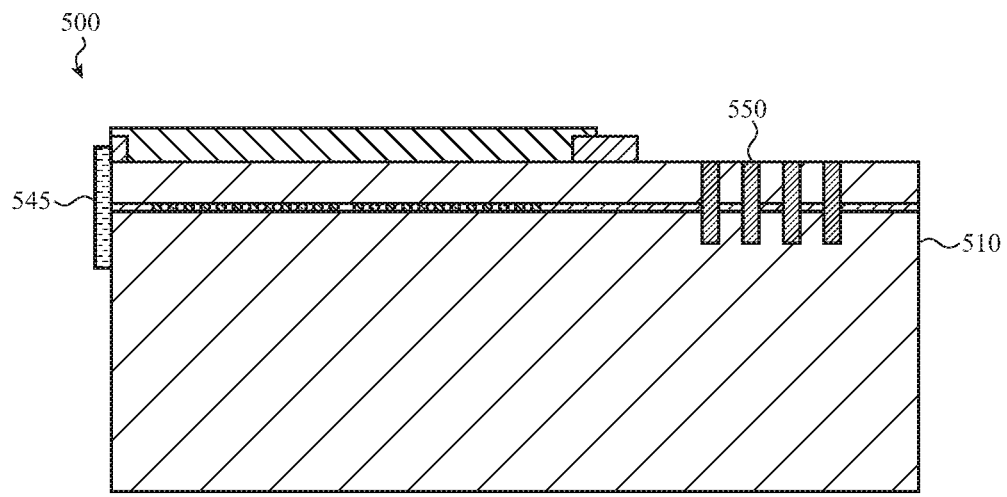
Figure 5N:
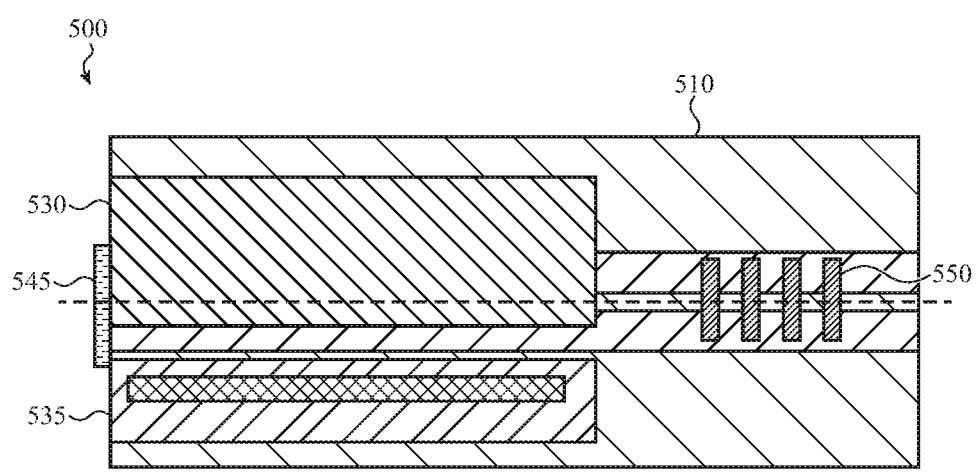
Figure 5O:
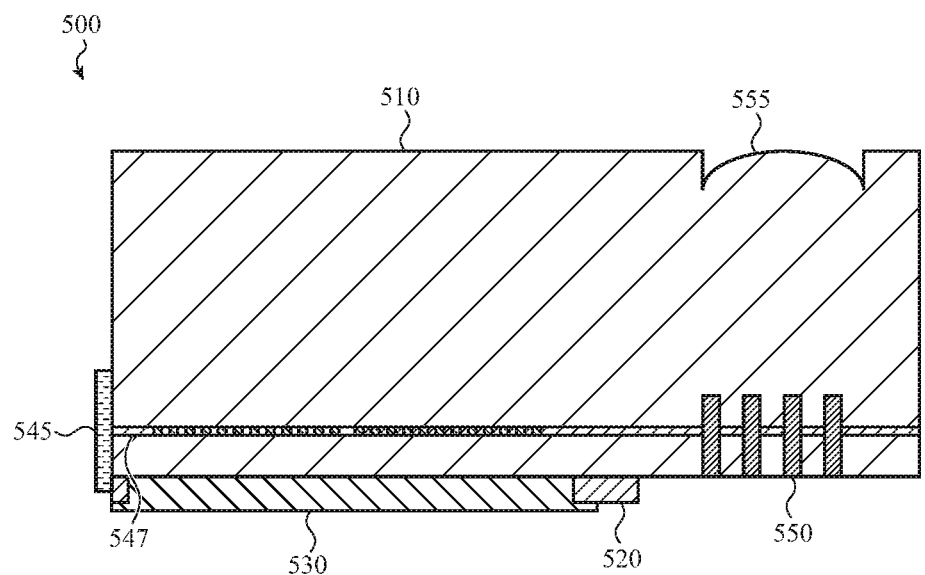
Figure 5P:
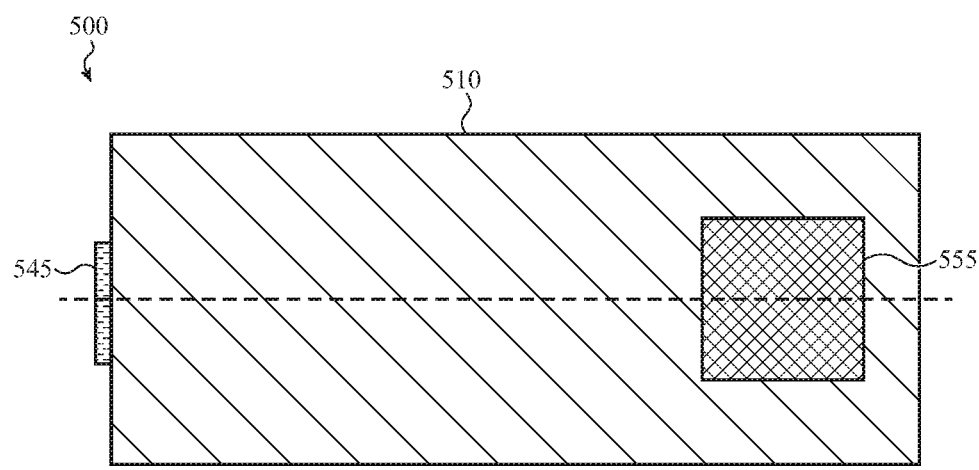
Figure 5Q:
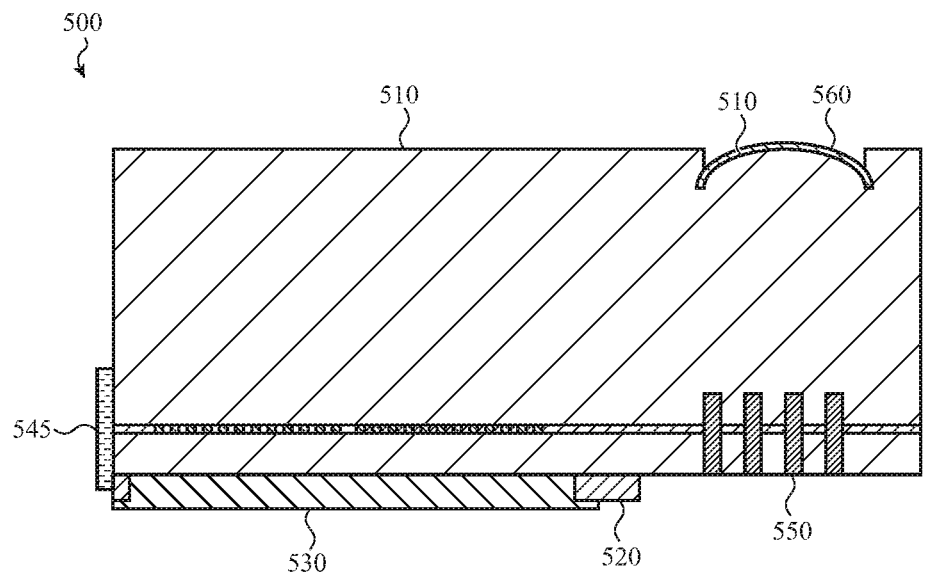
Figure 5R:
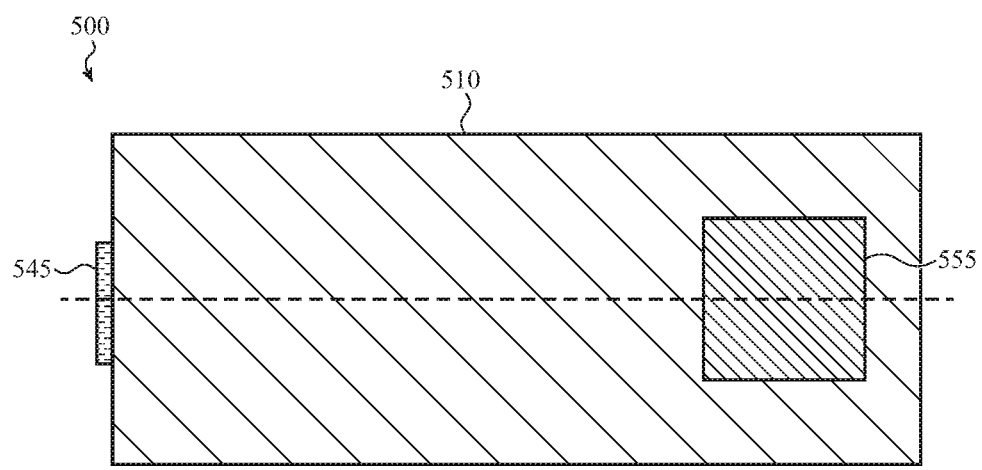

FIGS. 5A-5R illustrate an example fabrication process of an edge-generated vertical emission laser. FIG. 5A is a side view and FIG. 5B is a top view illustrating a starting material of an edge-generated vertical emission laser 500. Although the structures illustrated in FIGS. 5A-5R may be described as an edge-generated vertical emission laser 500, the structures illustrated in FIGS. 5A-5R may be structures at various fabrication operations to create an edge-generated vertical emission laser 500. Additionally, FIGS. 5A-5R illustrate the edge-generated vertical emission laser in an inverted position because the fabrication of the edge-generated vertical emission laser may be performed with the edge-generated vertical emission laser in an inverted position. As will be described with reference to FIGS. 5O-5P, the edge-generated vertical emission laser may be flipped over. As such, although various views are referred to as the "top view," once the fabrication of the edge-generated vertical emission laser is completed, the "top view" becomes the bottom surface of the edge-generated vertical emission laser. In FIG. 5A, the starting material may be a DFB laser structure 540 with the gratings 505 etched and regrown. In some examples, the DFB laser structure 540 may be indium phosphide. In some examples, the indium phosphide regrowth step may form a buried heterostructure, which may surround the waveguide. This may improve heat dissipation and may reduce spreading current, which may improve the functionality for narrow waveguides. In some examples, the substrate 510 may be moderately doped (e.g., in the approximate range of 2E17-1E18 cm-3-5E17-1E18 cm-3).

FIG. 5C is a side view and FIG. 5D is a top view illustrating a waveguide etch. In some examples, the waveguide 515 may be etched into the substrate 510. Etching the waveguide 515 into the substrate 510 may be achieved with wet or dry etching. FIG. 5E is a side view and FIG. 5F is a top view of a passivation layer and a contact window opening. As shown in FIGS. 5E and 5F, the passivation layer 520 may be deposited and may passivate the surface of the edge-generated vertical emission laser 500. The passivation layer 520 may provide a conformal coating over the surface of the edge-generated vertical emission laser 500.

Next, a contact window opening 525 may be etched into the passivation layer 520. As depicted in the top view of FIG. 5F, the contact window opening 525 may be positioned approximately over the gratings 505 of the DFB laser structure 540. The contact window opening 525 may allow a metal contact layer to be deposited and may contact the appropriate part of the DFB laser structure. In some examples, the contact window opening 525 may open a window of the waveguide 515.

FIG. 5G is a side view and FIG. 5H is a top view illustrating the addition of a p-metal contact layer to the edge-generated vertical emission laser 500. In FIG. 5G, the p-metal contact layer 530 may be deposited and may contact the top of the waveguide 515 through the contact window opening 525 in the passivation layer 520. The p-metal contact layer 530 may be any metal or combination of metals such as titanium, platinum, gold, any combination thereof, and so forth. In some examples, the p-metal contact layer 530 may extend laterally beyond the width of the waveguide 515, which may allow for contact for packaging purposes.

FIG. 5I is a side view and FIG. 5J is a top view illustrating the addition of an n-metal contact layer to the edge-generated vertical emission laser 500. The n-metal contact layer 535 may be created by first etching a trench down to the n-type highly doped material below the quantum wells of the DFB laser structure 540. The n-metal may be deposited into the trench to make electrical contact to the n-type material which, in some examples, may be indium phosphide. In some examples, the n-metal contact layer 535 may be a different metal than the p-metal contact layer 530. The n-metal contact layer 535 may provide a good ohmic contact to the n-type highly doped indium phosphide while the p-metal contact layer 530 may fulfill different specifications for packaging contact. In some examples, the n-metal may be any metal or combination of metals, such as gold, germanium, gold/germanium, nickel, gold/germanium alloy, any combination thereof, and so forth. Also, as depicted in FIG. 5J, the n-metal contact layer 535 may have a different area than the p-metal contact layer 530. In some examples, the n-metal contact layer 535 may cover a larger surface area of the edge-generated vertical emission laser 500 than the p-metal contact layer 530.

FIG. 5K is a side view and FIG. 5L is a top view illustrating a material on the back facet of the edge-generated vertical emission laser 500. As depicted in FIG. 5K, the material 545 may be positioned at the back facet of the edge-generated vertical emission laser 500. In some examples, the material 545 may be a high-reflectivity material and may function as a mirror. The high-reflectivity material may be employed at the back facet when light propagates toward the back facet of the edge-generated vertical emission laser 500 and, in some examples, the high-reflectivity mirror may be metal. In some examples, the material 545 may be an anti-reflective coating. In still further examples, the material 545 may be a dielectric stack 545, which may be highly reflective or anti-reflective depending on the materials and the thicknesses. In some embodiments, when the dielectric stack 545 is highly reflective, greater than 70% of the light may be reflected, while using anti-reflective material may provide for less than 30% of the light being reflected. The anti-reflective coating may be employed when a predetermined amount of light is directed to the back facet to be received by a photodetector. The "predetermined amount of light" is a portion of the light that is tapped (or otherwise split off) and directed to the photodetector, while the remainder of the light may exit the structure. The light is a "predetermined amount" insofar as the structure of the embodiment splits off approximately the same or the same amount of light every time. In some examples, the "predetermined amount" of light may be relatively small compared to the light generated in the DFB laser structure 540, so that most of the light may be vertically emitted from the edge-generated vertical emission laser 500. The photodetector may monitor various light properties such as the wavelength and optical power of the emitted light.

FIG. 5M is a side view and FIG. 5N is a top view illustrating a grating coupler being incorporated in the edge-generated vertical emission laser 500. As depicted in FIG. 5M, the grating coupler 550 may be etched into the waveguide 515. In some examples, the grating coupler 550 may direct light such that the edge-generated vertical emission laser may vertically emit light from the top surface and perpendicular to the DFB laser structure 540, and also perpendicular to the active region of the DFB laser structure 540. As described with reference to FIGS. 3 and 4, the grating coupler 550 may be a high contrast grating coupler, a time parity grating coupler, a first order grating, a second order grating, any combination thereof, and so forth. In some examples, the grating coupler 550 may primarily direct light toward the top surface of the edge-generated vertical emission laser 500 such that the vertically emitted light may be perpendicular to the top surface of the edge-generated vertical emission laser 500.

FIG. 5O is a side view and FIG. 5P is a top view illustrating the addition of an optical element to the edge-generated vertical emission laser 500. As shown in FIG. 5O, the edge-generated vertical emission laser 500 may be flipped over and an optical element 555 may be added to the top surface of the edge-generated vertical emission laser. The optical element 555 may be a microlens array that may be fabricated directly in the substrate, and that may collimate and direct or steer the light at the surface of the edge-generated vertical emission laser 500. In some examples, the optical element 555 may be a grating as described with reference to embodiments of both FIGS. 3 and 4. In some examples, the optical element 555 may be a bonded microlens array as opposed to a fabricated and integrated microlens array as depicted in FIGS. 5O and 5P. Additionally, as depicted in FIG. 5O, the material 545 may be a reflective material, a partially reflective material or an anti-reflective material. In some examples, the material 545 may be a dielectric stack and the reflective properties may change depending on the inclusion of a photodetector and/or application.

FIG. 5Q is a side view and FIG. 5R is a top view illustrating the addition of an anti-reflective coating. In some examples, the anti-reflective coating 560 may be deposited directly on the optical element 555. Additionally, in the example when the optical element 555 is a grating, the anti-reflective coating 560 may instead be a grating surface that may be deposited on the grating.

Figure 6:
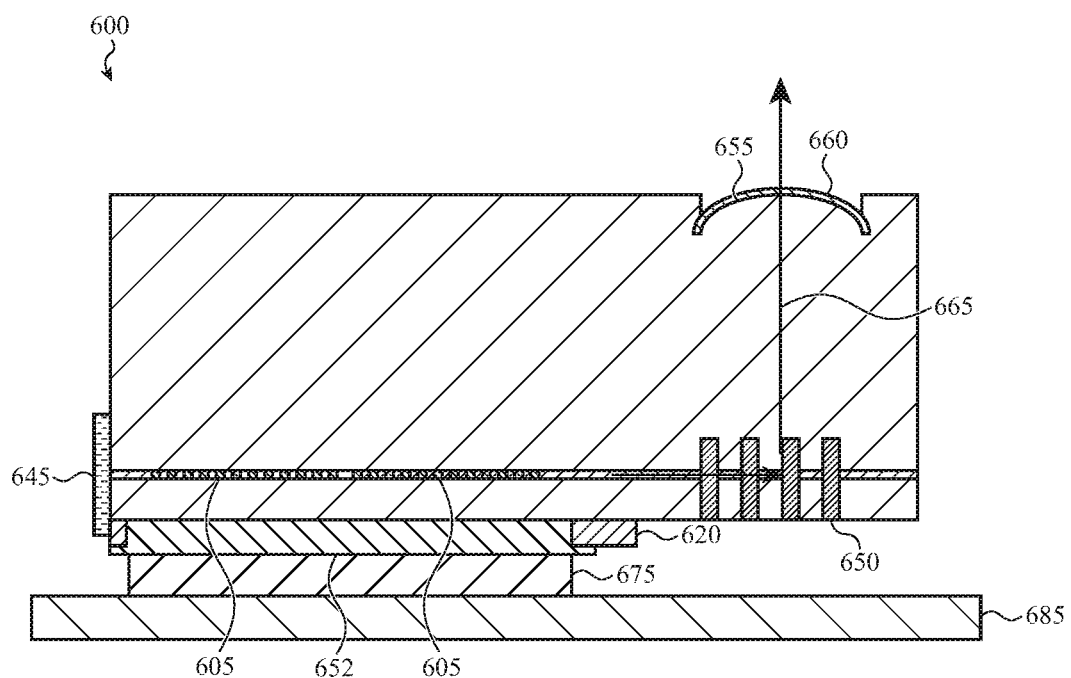
FIG. 6 is a side view of a packaged edge-generated vertical emission laser.

FIG. 6 is a side view of a packaged edge-generated vertical emission laser 600. The packaged edge-generated vertical emission laser 600 of FIG. 6 illustrates a packaged part with vertical emission from the edge-generated vertical emission laser and a flip-chip/surface-mount attachment. As shown in FIG. 6, the contact layer 652 on the bottom surface may be surface mounted to provide an electrical interconnect 675 to external circuitry on, for example, a printed circuit board 685. The vertical emission of light from the edge-generated vertical emission laser may facilitate on-wafer testing, which may increase laser yield during processing. Additionally, the vertical emission of light from the edge-generated vertical emission laser may allow increased options for integrating the edge-generated vertical emission laser into packaging. In some examples, the vertical emission of light may allow the edge-generated vertical emission laser to be incorporated into a smaller package and generally provide incorporation into small handheld devices such as mobile devices and wearable devices. Further, the vertical emission of light from the edge-generated vertical emission laser may provide the packaging and test benefits of a VCSEL, but may provide the wavelength range of light, design flexibility, reliability, and optical power of an edge-emitting laser.

Figure 7:
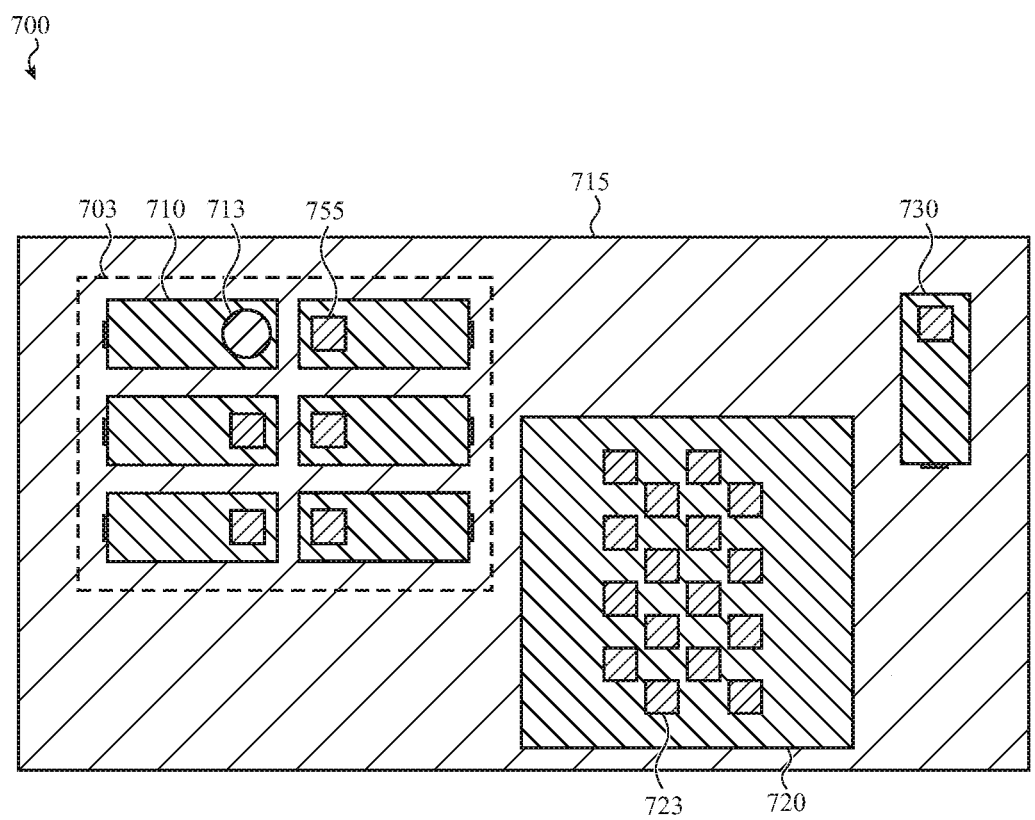
FIG. 7 is a top view of multiple edge-generated vertical emission laser packages.

FIG. 7 is a top view of multiple edge-generated vertical emission laser packages 700. FIG. 7 illustrates various examples of packaged edge-generated vertical emission lasers. The array 703 of single light sources 710 illustrates a 3 by 2 array of edge-generated vertical emission lasers on a packaging substrate 715. Although a 3 by 2 array is illustrated, the individual edge-generated vertical emission lasers may be configured into any array size as appropriate. The array 703 of single light sources 710 also depicts light 713 being vertically emitted into free space from the one of the edge-generated vertical emission lasers. The array of single light sources 710 may also be individually addressable, run all at the same time, and/or flip-chip packaged as appropriate.

Also included in FIG. 7 is the single chip array 720. The single chip array 720 illustrates multiple edge-generated vertical emission lasers 723 provided in an array on a single die 720. The lasers of the single chip array 720 may be individually addressed or may be driven all at once. Although the array is illustrated as offsetting the edge-generated vertical emission lasers in alternating rows, any appropriate configuration may be used with any number of edge-generated vertical emission lasers. Additionally, a single light source 730 is illustrated on the packaging substrate 715, which may be an edge-generated vertical emission laser that vertically emits light.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art that many modifications and variations are possible in view of the above teachings.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

What is claimed is:

1. An edge-generated vertical emission laser that vertically emits light, comprising:
a distributed feedback (DFB) laser structure configured to generate light that propagates parallel to a top surface of the edge-generated vertical emission laser;
a grating coupler, configured to receive the generated light from the DFB laser structure and direct the generated light toward the top surface of the edge-generated vertical emission laser that is perpendicular to the top surface of the edge-generated vertical emission laser;

a passivation layer deposited on a surface of the DFB laser structure;

an optical element formed in the passivation layer and configured to allow light to emit from the top surface of the edge-generated vertical emission laser; and a metal contact on a bottom surface of the edge-generated vertical emission laser, the bottom surface opposite the top surface of the edge-generated vertical emission laser.

2. The edge-generated vertical emission laser that vertically emits light of claim 1, wherein:

the metal contact comprises:
an n-metal contact on the bottom surface of the edge-generated vertical emission laser; and
a p-metal contact on the bottom surface of the edge-generated vertical emission laser;

the optical element is a collimating and light directing optical element; and the edge-generated vertical emission laser further comprises an anti-reflective coating on the optical element.

3. The edge-generated vertical emission laser that vertically emits light of claim 1, wherein:

the optical element comprises an integrated microlens array; and the edge-generated vertical emission laser further comprises an anti-reflective coating disposed on the integrated microlens array.

4. The edge-generated vertical emission laser that vertically emits light of claim 1, wherein the grating coupler is a high contrast grating configured to direct light to the top surface of the edge-generated vertical emission laser.

5. The edge-generated vertical emission laser that vertically emits light of claim 1, wherein:

the metal contact comprises:
an n-metal contact; and
a p-metal contact; wherein:
the n-metal contact and p-metal contact are both on the bottom surface of the edge-generated vertical emission laser, thereby providing electrical contact on one side of the edge-generated vertical emission laser.

6. The edge-generated vertical emission laser that vertically emits light of claim 1, wherein the grating coupler is a time parity grating coupler operative to direct light to the top surface of the edge-generated vertical emission laser.

7. The edge-generated vertical emission laser that vertically emits light of claim 6, further comprising:

a back facet of the DFB laser structure; and
a high reflectivity material positioned at the back facet of the DFB laser structure.

8. The edge-generated vertical emission laser that vertically emits light of claim 1, wherein the grating coupler is a second order grating.

9. The edge-generated vertical emission laser that vertically emits light of claim 1, wherein the metal contact is operative to redirect light propagating toward the bottom surface of the edge-generated vertical emission laser to the top surface of the edge-generated vertical emission laser.

10. The edge-generated vertical emission laser that vertically emits light of claim 1, further comprising:

a back facet of the DFB laser structure coated with an anti-reflective material; and a high reflectivity material positioned at the back facet of the DFB laser structure.

11. A method for providing vertically emitting light using an edge-generated vertical emission laser, comprising:

generating light in a distributed feedback (DFB) laser structure that propagates parallel to a top surface of the edge-generated vertical emission laser and within the DFB laser structure;

directing, using a grating coupler that is part of the edge-generated vertical emission laser, light from the DFB laser structure toward an optical element formed in a passivation layer, wherein the passivation layer is deposited on the top surface of the edge-generated vertical emission laser; and emitting light perpendicular to an active region of the DFB laser structure and from the top surface of the edge-generated vertical emission laser.

12. The method of claim 11, wherein the optical element comprises diffractive optics and further comprising:

providing a p-metal contact on a bottom surface of the edge-generated vertical emission laser;
providing an n-metal contact on the bottom surface of the edge-generated vertical emission laser;
reflecting, via a high-reflectivity material, light from a back facet of the DFB laser structure; and
steering the emitted light using the diffractive optics at the top surface of the edge-generated vertical emission laser.

13. The method of claim 11, further comprising:

emitting a predetermined amount of light from a back facet of the DFB laser structure of the edge-generated vertical emission laser;
detecting the emitted predetermined amount of light using a photodetector; and
monitoring properties of the emitted predetermined amount of light using the photodetector.

14. The method of claim 11, further comprising:

directing the light emitted from the top surface of the edge-generated vertical emission laser using a bonded microlens array.

15. The method of claim 11, further comprising:

providing a p-metal contact on a bottom surface of the edge-generated vertical emission laser;
providing an n-metal contact on the bottom surface of the edge-generated vertical emission laser; and
redirecting the generated light propagating toward the bottom surface of the edge-generated vertical emission laser back to the top surface of the edge-generated vertical emission laser.

16. An edge-generated vertical emission laser, comprising:

a distributed feedback (DFB) laser structure configured to generate light;
a waveguide operative to propagate the generated light parallel to a top surface of the edge-generated vertical emission laser;
a passivation layer is deposited on a surface of the DFB laser structure;
a grating coupler that is part of the edge-generated vertical emission laser, operative to reflect the generated light toward a top surface of the edge-generated vertical emission laser such that the light is emitted perpendicular to the top surface of the edge-generated vertical emission laser;
a diffraction based collimating optical element is in a passivation layer positioned to receive the generated light from the grating coupler; and
a metal contact on a bottom surface of the edge-generated vertical emission laser, the bottom surface opposite the top surface of the edge-generated vertical emission laser.

17. The edge-generated vertical emission laser of claim 16, wherein:
the metal contact is an n-metal contact; and
the edge-generated vertical emission laser further comprises:
a p-metal contact on a same side of the edge-generated vertical emission laser as the n-metal contact; and
an anti-reflective coating disposed on the diffraction based collimating optical element.

18. The edge-generated vertical emission laser of claim 16, further comprising:
a back facet configured to receive a portion of the generated light propagating away from the grating coupler in the waveguide; and
an anti-reflective coating disposed on the back facet.

19. The edge-generated vertical emission laser of claim 16, further comprising:
a back facet configured to receive a portion of the generated light propagating away from the grating coupler in the waveguide; and
a dielectric stack disposed on the back facet of the edge-generated vertical emission laser.

20. The edge-generated vertical emission laser of claim 16, wherein the diffraction based collimating optical element comprises a grating.

* * * * *